United States Patent [19]
Park et al.

[11] Patent Number: 6,112,430
[45] Date of Patent: Sep. 5, 2000

[54] VACUUM DRYER AND METHOD OF DRYING SEMICONDUCTOR DEVICE USING THE SAME

[75] Inventors: Chan-geun Park, Seongnam; Jong-jae Lee, Jinjoo, both of Rep. of Korea

[73] Assignee: Samsung Electronics Co., Ltd., Suwon, Rep. of Korea

[21] Appl. No.: 09/493,158

[22] Filed: Jan. 28, 2000

Related U.S. Application Data

[62] Division of application No. 09/115,231, Jul. 14, 1998.

[30] Foreign Application Priority Data

Jul. 15, 1997 [KR] Rep. of Korea ................ 97-32898

[51] Int. Cl.[7] ................................................ F26B 7/00
[52] U.S. Cl. ......................... 34/381; 34/407; 134/25.4
[58] Field of Search .......................... 34/312, 313, 317, 34/380, 381, 406, 407, 415, 426; 134/2, 25.4, 26, 30, 37

[56] References Cited

U.S. PATENT DOCUMENTS

| | | |
|---|---|---|
| 4,507,539 | 3/1985 | Sando et al. ................ 34/406 X |
| 4,841,645 | 6/1989 | Bettcher et al. ................ 34/78 |
| 5,203,927 | 4/1993 | Yoshida et al. ................ 134/21 |
| 5,315,766 | 5/1994 | Roberson, Jr. et al. ........... 34/409 |
| 5,520,744 | 5/1996 | Fujikawa et al. ............ 134/25.4 X |
| 5,553,396 | 9/1996 | Kato et al. ................... 34/406 |
| 5,727,578 | 3/1998 | Matthews .................... 134/61 |
| 5,800,626 | 9/1998 | Cohen et al. ................. 134/1.3 |
| 5,864,966 | 2/1999 | Singletery ................. 34/78 X |
| 6,027,574 | 2/2000 | Fishkin et al. ............... 134/30 |

*Primary Examiner*—Stephen Gravini
*Attorney, Agent, or Firm*—Jones Volentine, LLP

[57] ABSTRACT

A vacuum dryer and a method of drying a semiconductor device using the same are provided. In the present invention, a vacuum dryer using isopropyl alcohol vapor, including an outer bath, an inner bath, a main water supply line, a supplementary water supply line, an inner bath drain line, and an outer bath drain line, is provided. After cleaning the inside of the vacuum dryer, the inner bath is filled with the supplied deionized water and the deionized water is continuously overflowed. Then, the semiconductor substrate is loaded into the inner bath of the vacuum dryer to which the deionized is continuously overflowed. The loaded semiconductor substrate is dried by supplying the isopropyl alcohol vapor to the inner bath into which the semiconductor substrate is loaded.

9 Claims, 3 Drawing Sheets

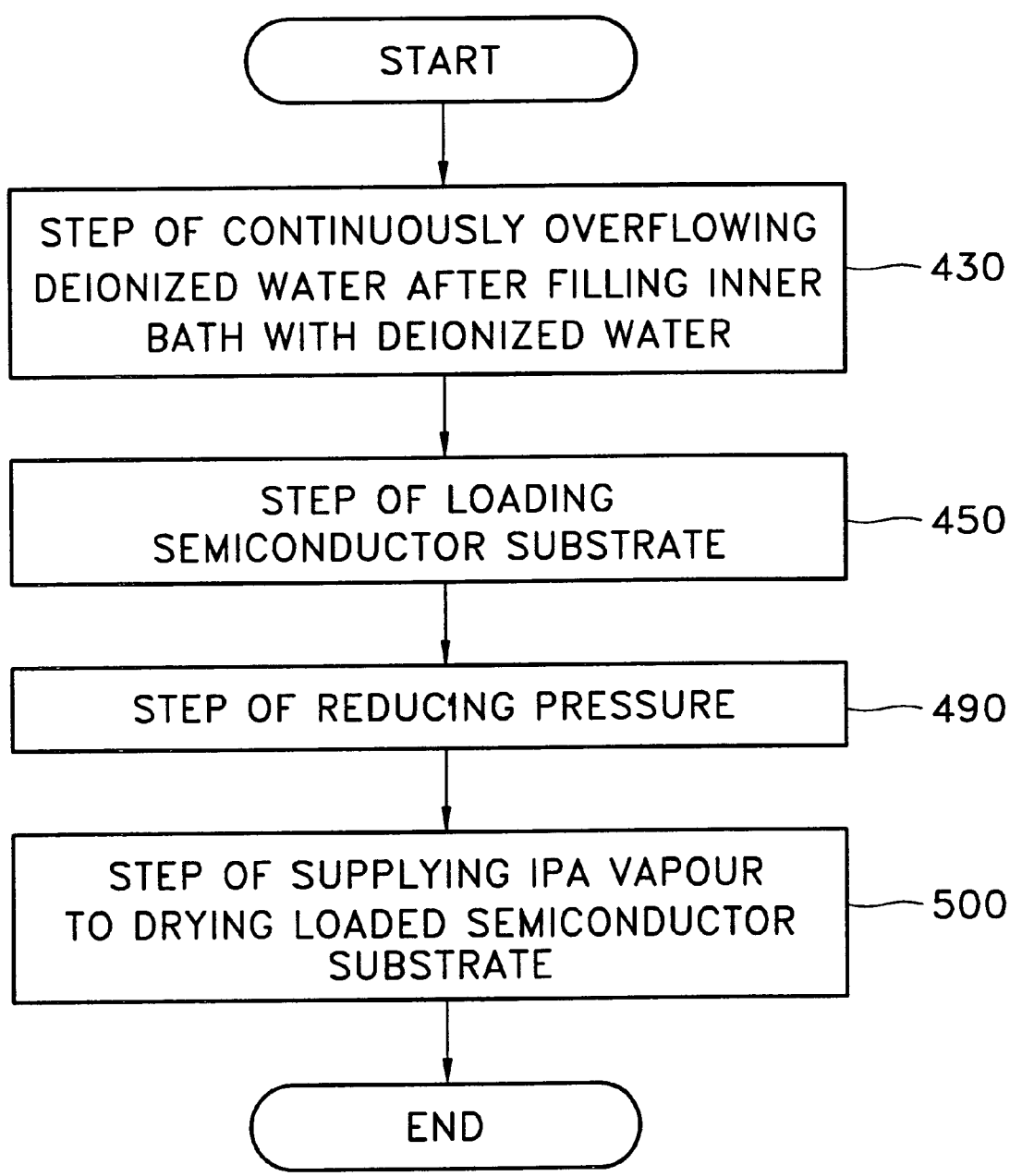

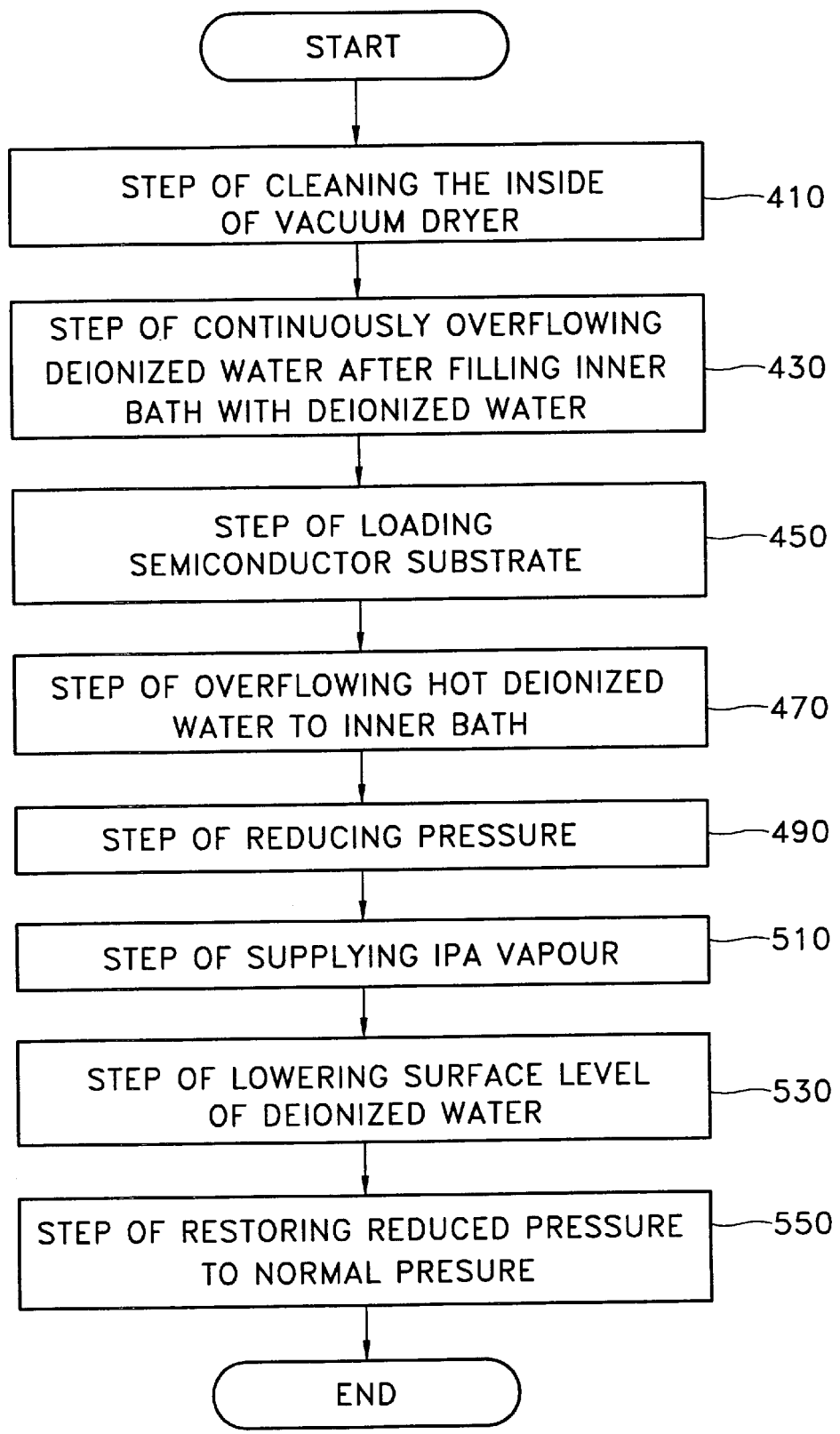

VACUUM DRYER AND METHOD OF DRYING SEMICONDUCTOR DEVICE USING THE SAME

CROSS REFERENCE TO RELATED APPLICATIONS

This is a divisional application of application Ser. No. 09/115,231, filed Jul. 14, 1998, which is hereby incorporated by reference in its entirety for all purposes.

BACKGROUND OF THE INVENTION

1. Field of the Invention

The present invention relates to a method of drying a semiconductor device, and more particularly, to a method of drying a semiconductor device using a vacuum dryer in which isopropyl alcohol (IPA) is used.

2. Description of the Related Art

As a semiconductor devices become more highly integrated, a cleaning process performed before and after a process of forming a material film on a semiconductor substrate and a process of patterning the material film becomes more important. Accordingly, a drying process of completing the cleaning process becomes more important.

Currently, a spin dryer and an IPA vapor dryer are used as a dryer for drying the semiconductor device. A drying method in which the spin dryer is used has a problem in that spots are generated. Also, since high speed rotation is involved, particles may become recontaminated. A drying method in which the IPA vapor dryer is used includes a process of heating IPA in an open bath. Therefore, it is difficult to secure stability. Also, environmental pollution is caused since a large amount of IPA is used.

A vacuum dryer is obtained by improving the above-mentioned IPA vapor dryer. In the drying method in which the vacuum dryer is used, the amount of IPA consumed is less than that of the IPA vapor dryer. Therefore, it is possible to reduce the degree of environmental pollution caused by the IPA. Also, it is possible to obtain an excellent drying effect regardless of the presence of the pattern. However, as the semiconductor device is further integrated, recontamination by particles in the drying method in which the vacuum dryer is used comes into question. Therefore, a method of drying a semiconductor device by which it is possible to more stably prevent recontamination by particles is required.

SUMMARY OF THE INVENTION

To solve the above problem, it is an objective of the present invention to provide a vacuum dryer using IPA vapor by which it is possible to prevent the recontamination by particles.

It is another objective of the present invention to provide a method of drying a semiconductor device using the above-mentioned vacuum dryer.

Accordingly, to achieve the first objective, there is provided a vacuum dryer, comprising an outer bath, an inner bath located inside the outer bath and into which a semiconductor substrate is loaded, a water supply line connected to the inner bath for supplying deionized water to the inner bath, an inner bath drain line connected to the inner bath for draining the deionized water filled in the inner bath, and a supply pipe connected to the outer bath for supplying isopropyl alcohol vapor to the semiconductor substrate loaded into the inner bath.

The water supply line comprises a main water supply line for supplying deionized water to the inner bath to fill the inner bath with the deionized water and a supplementary water supply line for supplying additional deionized water to the inner bath in supplement to the main water supply line to overflow the deionized water from the inner bath. The deionized water supplied from the main water supply line and the supplementary water supply line is cold. Alternatively, the deionized water supplied from the main water supply line is cold and the deionized water supplied from the supplementary water supply line is hot. The supplementary water supply line and, the main water supply line are connected to each other and the inner bath such that the water supplied into the inner bath can be from either the main water supply line or from the supplementary water supply line.

To achieve the first objective, there is provided a vacuum dryer, comprising an outer bath, an inner bath located inside the outer bath and into which a semiconductor substrate is loaded, a main water supply line connected to the inner bath for supplying deionized water with which the inner bath is filled, a supplementary water supply line connected to the inner bath for supplying additional deionized water to the inner bath to overflow the deionized water from the inner bath, an inner bath drain line connected to the inner bath for draining the deionized water filled in the inner bath, an outer bath drain line connected to the outer bath for draining the deionized water overflowed from the inner bath, and a supply pipe connected to the outer bath for supplying isopropyl alcohol vapor to the semiconductor substrate.

The supplementary water supply line is connected to the main water supply line to allow switching from the main water supply line and is connected to the inner bath. The deionized water supplied from the main water supply line and the supplementary water supply line is cold. Alternatively, the deionized water supplied from the main water supply line is cold and the deionized water supplied from the supplementary water supply line is hot.

To achieve the second objective, there is provided a method of drying a semiconductor device. In the method, deionized water is continuously supplied to an inner bath of a vacuum dryer using IPA vapor comprised of an outer bath, an inner bath, and deionized water supplied through water supply lines to fill the inner bath with the deionized water, such that the deionized water is continuously overflowed from the inner bath to the outer bath. A semiconductor substrate is loaded into the inner bath from which the deionized water is continuously overflowed. The loaded semiconductor substrate is dried by supplying the isopropyl alcohol vapor to the inner bath into which the semiconductor substrate is loaded.

After the semiconductor substrate is loaded, the deionized water is additionally overflowed by supplying the deionized water to the inner bath. The deionized water supplied for additional overflow is hot. The deionized water supplied to the inner bath before the step of supplying the hot deionized water is cold. The step of drying the semiconductor substrate comprises the steps of reducing the pressure in the inner bath, supplying the isopropyl alcohol vapor to the inner bath, and lowering the level of the deionized water with which the inner bath is filled.

To achieve the second objective, there is provided a method of drying a semiconductor device. In the method, deionized water is supplied to an inner bath of a vacuum dryer using isopropyl alcohol vapor, comprised of an outer bath, an inner bath, a main water supply line, to fill the inner bath and a supplementary water supply line connected to the main water supply line. The deionized water is continuously supplied to the inner bath through the supplementary water supply line to overflow the deionized water from the inner bath to the outer bath. A semiconductor substrate is loaded into the inner bath of the vacuum dryer from which the deionized water is continuously overflowed. The loaded semiconductor substrate is dried by supplying IPA vapor to the inner bath into which the semiconductor substrate is loaded.

After the semiconductor substrate is loaded, the deionized water is additionally overflowed by supplying the deionized water to the inner bath. The deionized water supplied for the additional overflow is hot. The deionized water supplied to the inner bath before the step of supplying the hot deionized water is cold.

According to the present invention, it is possible to prevent generation of particles in deionized water which fills an inner bath by overflowing the deionized water by continuously supplying the deionized water after filling the inner bath of the vacuum dryer with the deionized water.

BRIEF DESCRIPTION OF THE DRAWINGS

The above objectives and advantages of the present invention will become more apparent by describing in detail a preferred embodiment thereof with reference to the attached drawings in which:

FIG. 2 is a flowchart schematically showing processes of a method of drying a semiconductor device according to an embodiment of the present invention; and FIG. 3 is a flowchart showing the processes shown in FIG. 2 in more detail.

DESCRIPTION OF THE PREFERRED EMBODIMENTS

Figure 1:
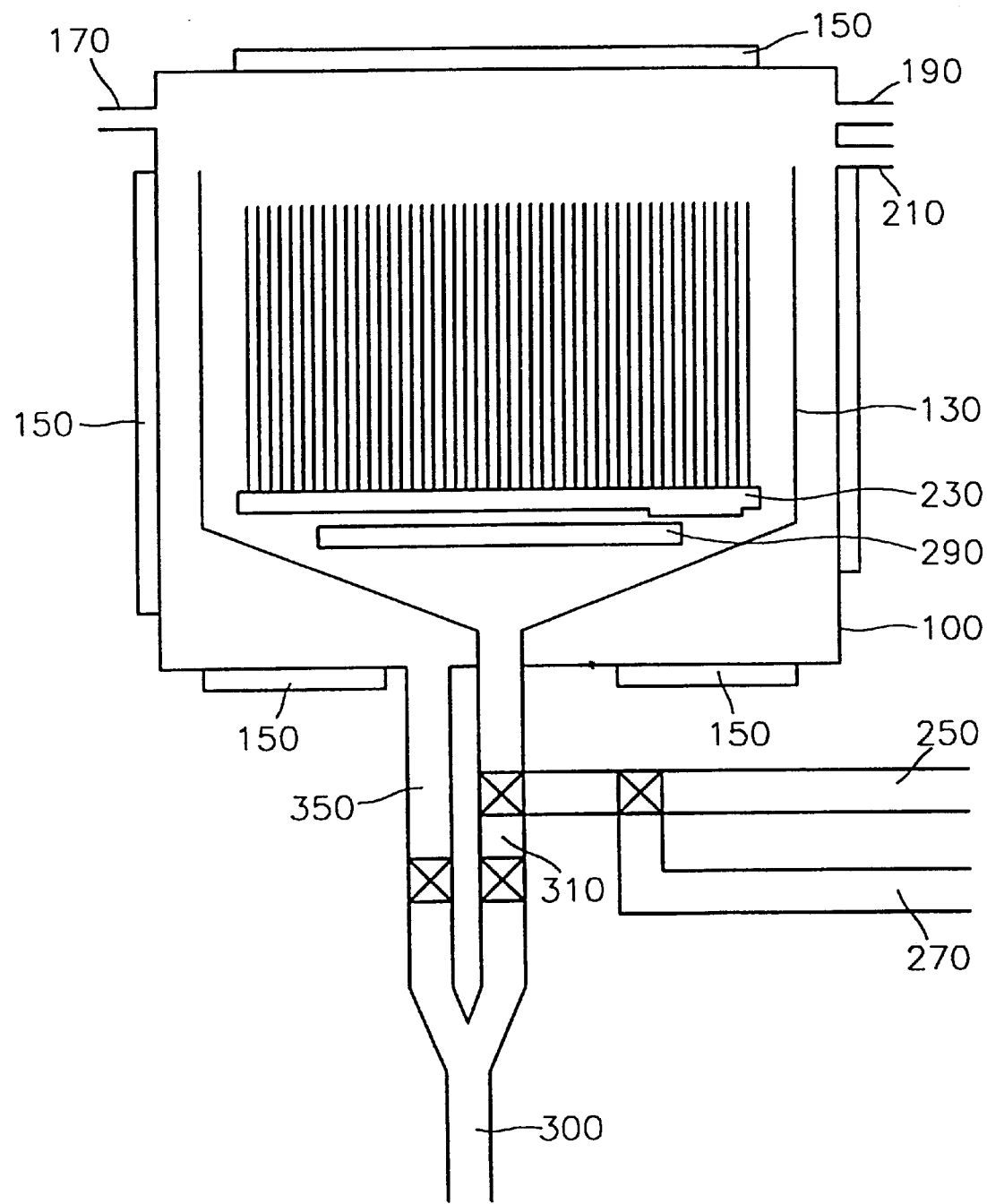
FIG. 1 schematically shows a vacuum dryer according to an embodiment of the present invention.

FIG. 1 schematically shows an embodiment of a vacuum dryer according to the present invention. As used herein, the terms cold and hot are used to describe the temperature of the deionized water. One of the ordinary skill in the art would readily understand that the terms cold and hot encompass a broad range of temperatures that are cold to the touch or hot to the touch.

To be specific, the vacuum dryer used in the present embodiment includes baths 100 and 130 comprised of an outer bath 100 and an inner bath 130 located inside the outer bath 100. A heater 150 for heating the outer bath 100 is attached to the outer bath. Also, a purge gas supply pipe 170 which is a path through which a purging gas is supplied to the baths 100 and 130 and an IPA vapor supply pipe 190 for supplying IPA vapor are attached to the outer bath. The vapor dryer further includes an exhaust pipe 210 for reducing pressure in the baths 100 and 130. A guide 230 for supporting the semiconductor substrate loaded in the inner bath 130 is located in the inner bath 130. The main water supply line 250 and the supplementary water supply line 270 connected to the inner bath 130 supply the deionized water to the inner bath 130.

For example, the supplementary water supply line 270 may be connected to the main water supply line 250, so as to selectively switch between the main water supply line 250 and the supplementary water supply line 270. By doing so, it is possible to fill the inner bath 130 with the deionized water supplied through the main water supply line 250.

Then, it is possible to overflow the deionized water from the inner bath 130 to the outer bath 100 by additionally supplying the deionized water to the inner bath 130 by switching from the main water supply line 250 to the supplementary water supply line 270.

It is possible to selectively supply solutions of different characteristics to the inner bath 130 by controlling the temperature of water in the water supply lines 250 and 270. For example, it is possible to perform the overflow by filling the inner bath 130 with cold deionized water supplied from the main water supply line 250 and supplying hot deionized water from the supplementary water supply line 270. By doing so, it is possible to control the temperature of the deionized water in the inner bath 130 when the overflow is performed. That is, it is possible to maintain the temperature of the deionized water with which the inner bath 130 is filled to be low by supplying cold deionized water or a negligible amount of hot deionized water from the supplementary water supply line 270 in an initial stage after supplying cold deionized water through the main water supply line 250. Then, it is possible to increase the temperature of the deionized water in the inner bath 130 by increasing the amount of hot deionized water supplied from the supplementary water supply line 270. On the contrary, it is possible to keep the temperature of the deionized water in the inner bath 130 low by continuously supplying cold deionized water from the supplementary water supply line 270, if necessary.

The vacuum dryer further includes a control guide 290 introduced for making the flow of the deionized water uniform and a drain line 300 for draining the supplied deionized water. The drain line 300 includes an inner bath drain line 310 connected to the bottom of the inner bath 130 for draining the deionized water filled in the inner bath 130 and an outer bath drain line 350 for draining the overflowed deionized water residing in the outer bath 100. The deionized water is aspirated by a pump (not shown) through the drain line 300 and is transferred to a tank (not shown) for managing organic waste water. Also, it is possible to reduce the pressure in the outer bath 100 through the outer bath drain line 350. Namely, the drain line 300 can operate as the exhaust pipe 210.

Referring to the vacuum dryer shown in FIG. 1 and the flowchart shown in FIG. 2, the method of drying the semiconductor device according to the present embodiment will be described as follows. First, the inner bath 130 is filled with the deionized water. Then, the overflow is performed by continuously supplying the deionized water to the inner bath 130 (step 430). The semiconductor substrate is loaded into the inner bath 130, in particular, into the guide 230 (step 450). Then, the semiconductor substrate is dried by reducing the pressure of the inner bath 130 and the outer bath 100 and supplying IPA vapor to the inner bath 130 and the outer bath 100 (step 500).

The method will be described in more detail with reference to FIG. 3. First, the inside of the vacuum dryer is cleaned by supplying the deionized water to the inner bath 130 and the outer bath 100 (step 410). Then, the deionized water is continuously overflowed after filling the inner bath 130 of the cleaned dryer with the deionized water.

For example, the inner bath 130 is filled with the deionized water supplied through the main water supply line 250. Then, the deionized water is overflowed by continuously supplying the deionized water to the inner bath 130 through the supplementary water supply line 270 by switching from the main water supply line 250 to the supplementary water supply line 270. The deionized water is continuously overflowed for about 200 seconds until the semiconductor substrate is loaded.

At this time, the deionized water is preferably cold in order to prevent the semiconductor substrate from being recontaminated by particles. Also, the overflow may be performed by continuously supplying the deionized water to the main water supply line 250 after filling the inner bath 130 with the deionized water through the main water supply line 250. Furthermore, it is possible to selectively supply solutions of different characteristics to the supplementary water supply line 270 and the main water supply line 250. For example, it is possible to control the temperature of the inner bath 130 by overflowing the hot deionized water through the supplementary water supply line 270 after filling the inner bath 130 with the cold deionized water supplied to the inner bath 130 through the main water supply line 250.

Then, the semiconductor substrate is loaded into the inner bath 130 (step 450). The deionized water is continuously overflowed until the semiconductor substrate is completely loaded. It is possible to prevent the generation of the particles in the deionized water filled in the inner bath by continuously overflowing the deionized water. Therefore, recontamination by particles is prevented in the subsequent drying process. Then, the loaded semiconductor substrate is dried by supplying IPA vapor to the baths 100 and 130. The drying process proceeds as follows.

First, the hot deionized water is overflowed from the inner bath into which the semiconductor substrate is loaded (step 470). At this time, the cold deionized water can be used. However, as the temperature of the deionized water is increased, the semiconductor substrate is dried more easily due to IPA vapor. The hot deionized water is preferably supplied through the supplementary water supply line by switching from the main water supply line 250. By doing so, it is possible to change the temperature of the deionized water filled in the inner bath 130 more gradually, thus preventing a defect such as recontamination by particles.

Then, the pressure in the baths 100 and 130 is reduced through the exhaust pipe 210 and/or the outer bath drain line 350 (step 490). The IPA vapor is supplied to the baths 100 and 130 (step 510). By doing so, an interface comprised of the surface of the semiconductor substrate, atmosphere, and the deionized water is exposed to a mixed gas comprised of the IPA vapor and a purging gas such as $N_2$ gas. When the interface is exposed to the mixed gas, the semiconductor substrate is dried due to the difference in surface tensions. When the surface tensions of the interfaces of the IPA vapor, the $N_2$ gas, and the deionized water are in equilibrium, the water level of the deionized water is gradually lowered, thus continuously drying the semiconductor substrate (step 530). The level of the deionized water is lowered by draining the deionized water through the inner bath drain line 310.

After the semiconductor substrate is completely dried, the pressure in the baths 100 and 130 are restored to normal pressure (step 550). In the above-mentioned method of drying the semiconductor device, the number of particles on the semiconductor substrate is about three times less than in the conventional method in which the vacuum dryer is used, after the semiconductor substrate is completely dried.

According to the above-mentioned present invention, it is possible to prevent generation of particles in the deionized water with which the inner bath is filled by overflowing the deionized water by continuously supplying the deionized water after filling the inner bath of the vacuum dryer with the deionized water. Therefore, it is possible to prevent the semiconductor substrate from being recontaminated by the particles. Accordingly, it is possible to obtain better cleaner effects.

The present invention is not restricted to the above embodiment and it is clearly understood that many variations are possible within the scope and spirit of the present invention by one skilled in the art.

What is claimed is:

1. A method of drying a semiconductor device, comprising steps of:

continuously supplying deionized water to an inner bath of a vacuum dryer and continuously overflowing the deionized water from the inner bath to an outer bath;

loading a semiconductor substrate into the inner bath from which the deionized water is continuously overflowed; and drying the loaded semiconductor substrate by supplying isopropyl alcohol vapor to the inner bath into which the semiconductor substrate is loaded.

2. The method of claim 1, further comprising the step of additionally overflowing the deionized water by supplying the deionized water to the inner bath after the step of loading the semiconductor substrate.

3. The method of claim 2, wherein the deionized water supplied for additional overflow is hot.

4. The method of claim 3, wherein the deionized water supplied to the inner bath before the step of supplying the hot deionized water is cold.

5. The method of claim 2, wherein the step of drying the semiconductor substrate comprises steps of:

reducing pressure in the inner bath;

supplying the isopropyl alcohol vapor to the inner bath; and lowering a level of the deionized water with which the inner bath is filled.

6. A method of drying a semiconductor device, comprising steps of:

supplying deionized water to an inner bath of a vacuum dryer through a main water supply line to fill the inner bath;

continuously supplying the deionized water to the inner bath through a supplementary water supply line to overflow the deionized water from the inner bath to an outer bath;

loading a semiconductor substrate into the inner bath from which the deionized water is continuously overflowed; and drying the loaded semiconductor substrate by supplying isopropyl alcohol vapor to the inner bath into which the semiconductor substrate is loaded.

7. The method of claim 6, further comprising a step of additionally overflowing the deionized water by supplying the deionized water to the inner bath after the step of loading the semiconductor substrate.

8. The method of claim 7, wherein the deionized water supplied for the additional overflow is hot.

9. The method of claim 8, wherein the deionized water supplied to the inner bath before the step of supplying the hot deionized water is cold.

* * * * *